US009312272B2

(12) United States Patent
Erickson et al.

(10) Patent No.: US 9,312,272 B2
(45) Date of Patent: Apr. 12, 2016

(54) IMPLEMENTING BURIED FET UTILIZING DRAIN OF FINFET AS GATE OF BURIED FET (71) Applicant: GLOBALFOUNDRIES Inc., Grand Cayman (KY)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: Globalfoundries Inc., Ugland House (KY)

( * ) Notice: Subject to any disclaimer, the term of this patent is extended or adjusted under 35 U.S.C. 154(b) by 169 days.

(21) Appl. No.: 14/092,081

(22) Filed: Nov. 27, 2013

(65) Prior Publication Data

US 2015/0145047 A1    May 28, 2015

(51) Int. Cl.
*H01L 29/78* (2006.01)
*H01L 27/12* (2006.01)
*H01L 21/84* (2006.01)
*H01L 27/06* (2006.01)
*G06F 17/50* (2006.01)
*H01L 27/088* (2006.01)

(52) U.S. Cl.
CPC ......... *H01L 27/1207* (2013.01); *H01L 21/845* (2013.01); *H01L 27/0688* (2013.01); *H01L 27/1211* (2013.01); *G06F 17/5068* (2013.01); *H01L 27/0886* (2013.01)

(58) Field of Classification Search
CPC . H01L 27/12; H01L 27/1207; H01L 27/1211; H01L 29/7813; H01L 29/4236; H01L 29/66734; H01L 29/1095; H01L 29/0696
USPC .......................................... 257/330; 438/152
See application file for complete search history.

(56) References Cited

U.S. PATENT DOCUMENTS

| 7,368,354 | B2 | 5/2008 | Anderson et al. |
| 7,838,913 | B2 | 11/2010 | Cheng et al. |
| 8,138,543 | B2 | 3/2012 | Cheng et al. |
| 8,288,800 | B2 | 10/2012 | Zhu et al. |
| 2005/0189583 | A1* | 9/2005 | Kim et al. ...................... 257/327 |
| 2006/0197129 | A1 | 9/2006 | Wohlmuth |
| 2007/0170474 | A1 | 7/2007 | Kawasaki |
| 2010/0207182 | A1* | 8/2010 | Paschal .......................... 257/314 |

* cited by examiner

*Primary Examiner* — Monica D Harrison
(74) *Attorney, Agent, or Firm* — Heslin Rothenberg Farley & Mesiti P.C.; George Blasiak (57) ABSTRACT

A method and circuit for implementing an enhanced transistor topology with a buried field effect transistor (FET) utilizing the drain of a FinFET as the gate of the new buried FET and a design structure on which the subject circuit resides are provided. A drain area of the fin area of a FinFET over a buried dielectric layer provides both the drain of the FinFET as well as the gate node of a second field effect transistor. This second field effect transistor is buried in the carrier semiconductor substrate under the buried dielectric layer.

20 Claims, 7 Drawing Sheets

IMPLEMENTING BURIED FET UTILIZING DRAIN OF FINFET AS GATE OF BURIED FET

FIELD OF THE INVENTION

The present invention relates generally to the data processing field, and more particularly, relates to a method and circuit for implementing an enhanced transistor topology enabling increased circuit density with a buried field effect transistor (FET) utilizing the drain of a FinFET as the gate of the new buried FET, and a design structure on which the subject circuit resides.

DESCRIPTION OF THE RELATED ART

As semiconductor design geometries continue to shrink the areas required to land contacts and make the necessary metal connections have become dominate in limiting circuit densities.

An output or drain connection from one transistor to an input or gate connection of the logically subsequent transistor is the greatest density limiter.

A need exists for an effective mechanism and method for implementing an enhanced transistor topology enabling increased circuit density with a buried FET utilizing the drain of a FinFET as the gate of the new buried FET.

SUMMARY OF THE INVENTION

Principal aspects of the present invention are to provide a method and circuit for implementing a buried field effect transistor (FET) utilizing the drain of a FinFET as the gate of the new buried FET, and a design structure on which the subject circuit resides. Other important aspects of the present invention are to provide such method, circuit and design structure substantially without negative effect and that overcome many of the disadvantages of prior art arrangements.

In brief, a method and circuit for implementing an enhanced transistor topology with a buried field effect transistor (FET) utilizing the drain of a FinFET as the gate of the new buried FET and a design structure on which the subject circuit resides are provided. A drain area of the fin area of the FinFET over a buried dielectric layer provides the drain of the FinFET and provides the gate node of the buried FET. The buried FET is buried in the semiconductor substrate under the buried dielectric layer.

In accordance with features of the invention, the buried dielectric layer separating the top semiconductor from the carrier semiconductor is relatively thin enabling the novel new transistor to be formed and a new circuit topology established without the need for a contact to the logically first transistor output, a wire to a distant logically second transistor, and a contact to the gate node of the second transistor.

In accordance with features of the invention, the drain of the FinFET is used as the gate and to separate a new buried field effect transistor source and drain region. The FinFET drain is separated from the carrier semiconductor by the thin buried dielectric layer.

In accordance with features of the invention, the FinFET drain sits over the body of the newly formed buried field effect transistor. The spacer films utilized by the FinFET gate can be utilized on the sides of the fin to allow engineering of the dopant profiles of the buried drain and source. Traditional well doping techniques defined before the fins are etched can be utilized to define N-channel regions, P-channel regions or both if a suitable base doping concentration is not possible.

In accordance with features of the invention, gates typically serve as an input to more than one transistor; allowances are made to allow either multiple transistors of the same type and/or transistors of the opposite type utilizing the same fin as the gate to multiple buried transistors.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, an enhanced fabrication method and an enhanced circuit topology are provided. This invention utilizes a drain area of a fin area of a FinFET over a thin buried dielectric layer as both the drain of the traditional FinFET as well as the gate node of another field effect transistor. This second field effect transistor is buried in the carrier semiconductor under the buried dielectric layer.

In accordance with features of the invention, by making the buried dielectric layer separating the top semiconductor from the carrier semiconductor relatively thin a novel new transistor can be formed and the new circuit topology established without the need for a contact to the logically first transistor output, a wire to a distant logically second transistor, and a contact to the gate node of the second transistor.

Having reference now to the drawings, in FIGS. 1-5, there are shown example steps and structure for implementing an enhanced transistor topology with a buried field effect transistor (FET) utilizing the drain of a FinFET as the gate of the new buried FET in accordance with the preferred embodiment.

Figure 1:
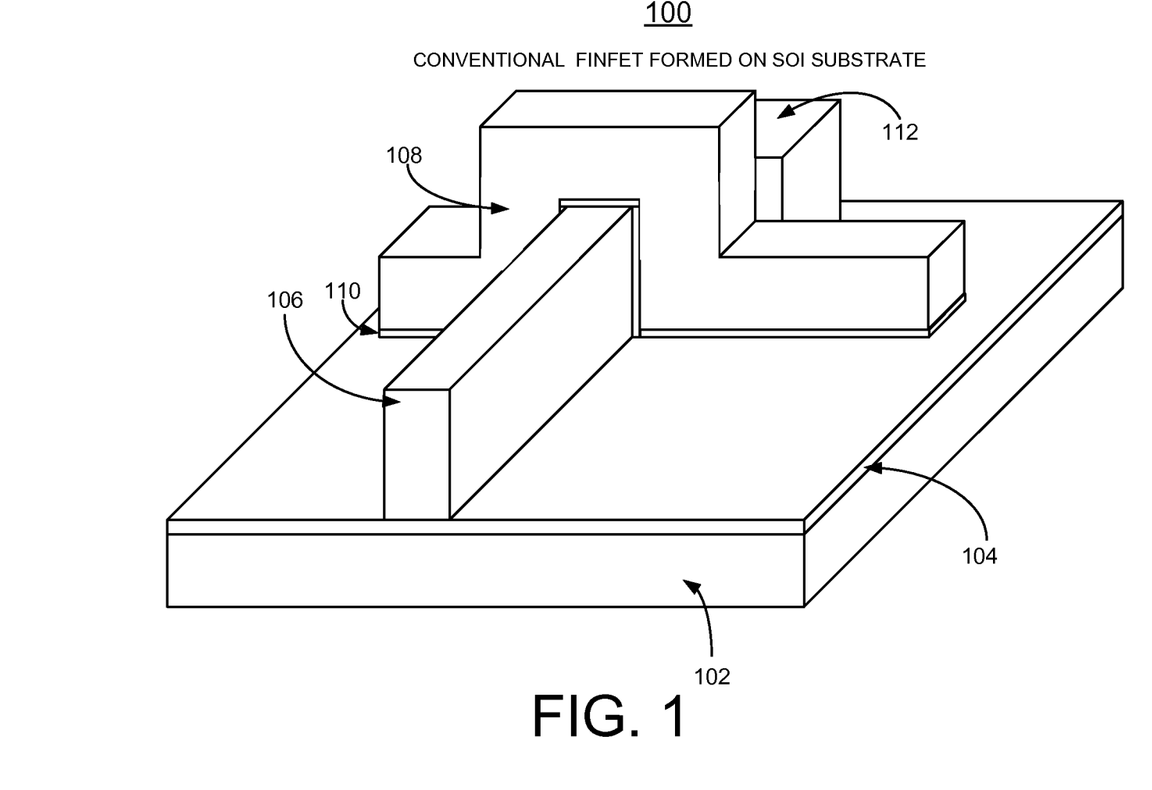
FIGS. 1, 2, 3, 4, 5 illustrate example structures and process steps for implementing an enhanced transistor topology with a buried field effect transistor (FET) utilizing the drain of a FinFET as the gate of the new buried FET in accordance with the preferred embodiment.

In FIG. 1, a processing step begins with a formed FinFET generally designated by the reference character 100. The FinFET 100 is formed using traditional fabrication technique on a silicon-on-insulator (SOI) substrate separated from a semiconductor substrate 102 by an intervening buried oxide (BOX) or dielectric layer 104. The FinFET 100 includes a drain region 106, a gate region 108 formed on a gate dielectric 110, and a source region 112. In FIG. 1, the sidewalls are ignored to more clearly show the cross-section of the FinFET 100. The dielectric layer 104 is a thin buried dielectric layer having a thickness of a few nm, such as a thin silicon dioxide ($SiO_2$) layer or other suitable dielectric material.

Figure 5:
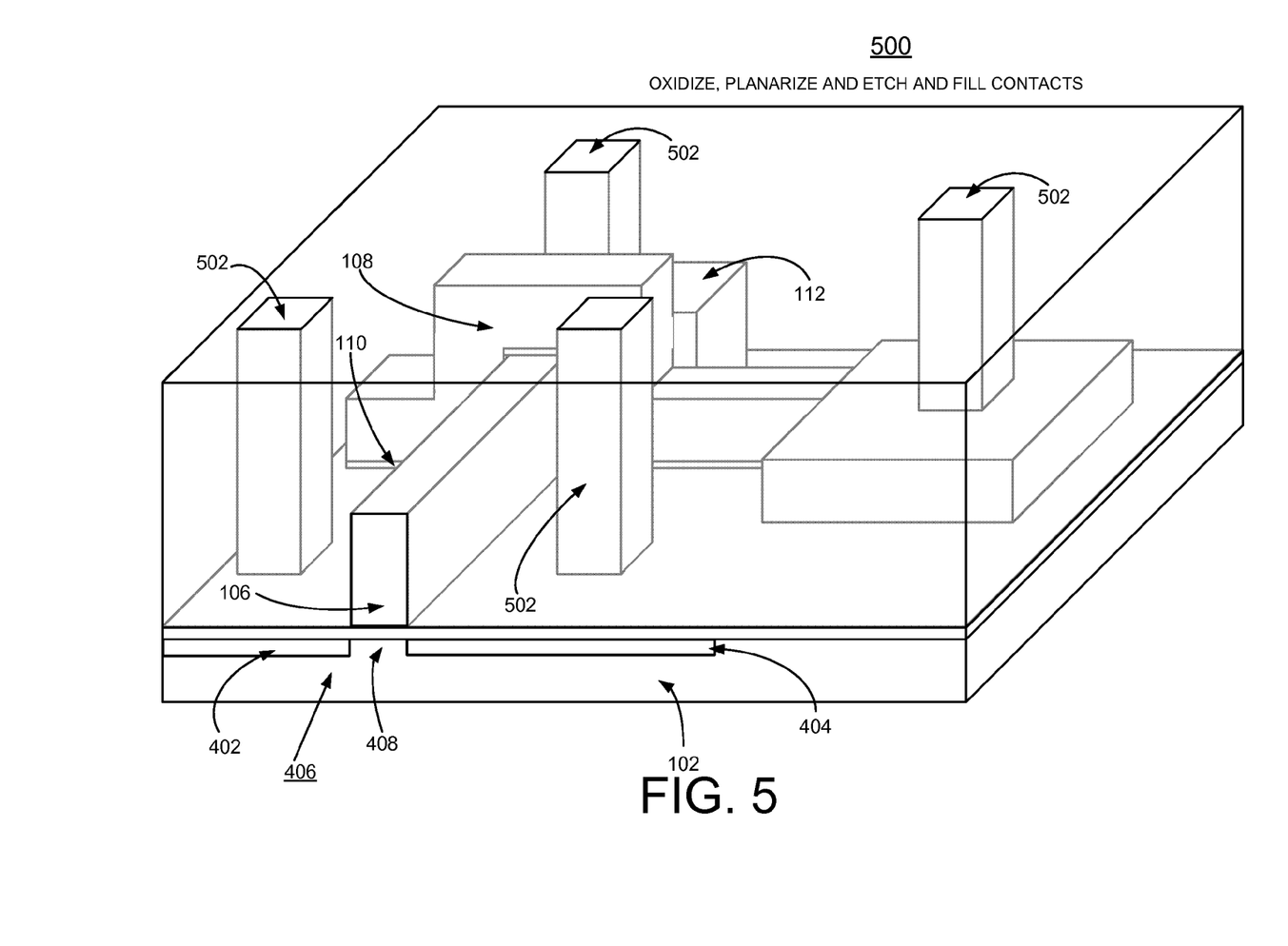

As shown, the source region 112 has a larger width than the drain region 106 to provide a landing pad or dog-bone end required for a contact, which is needed on one end of the FinFET, such as a contact 502 as shown in FIG. 5.

Figure 2:
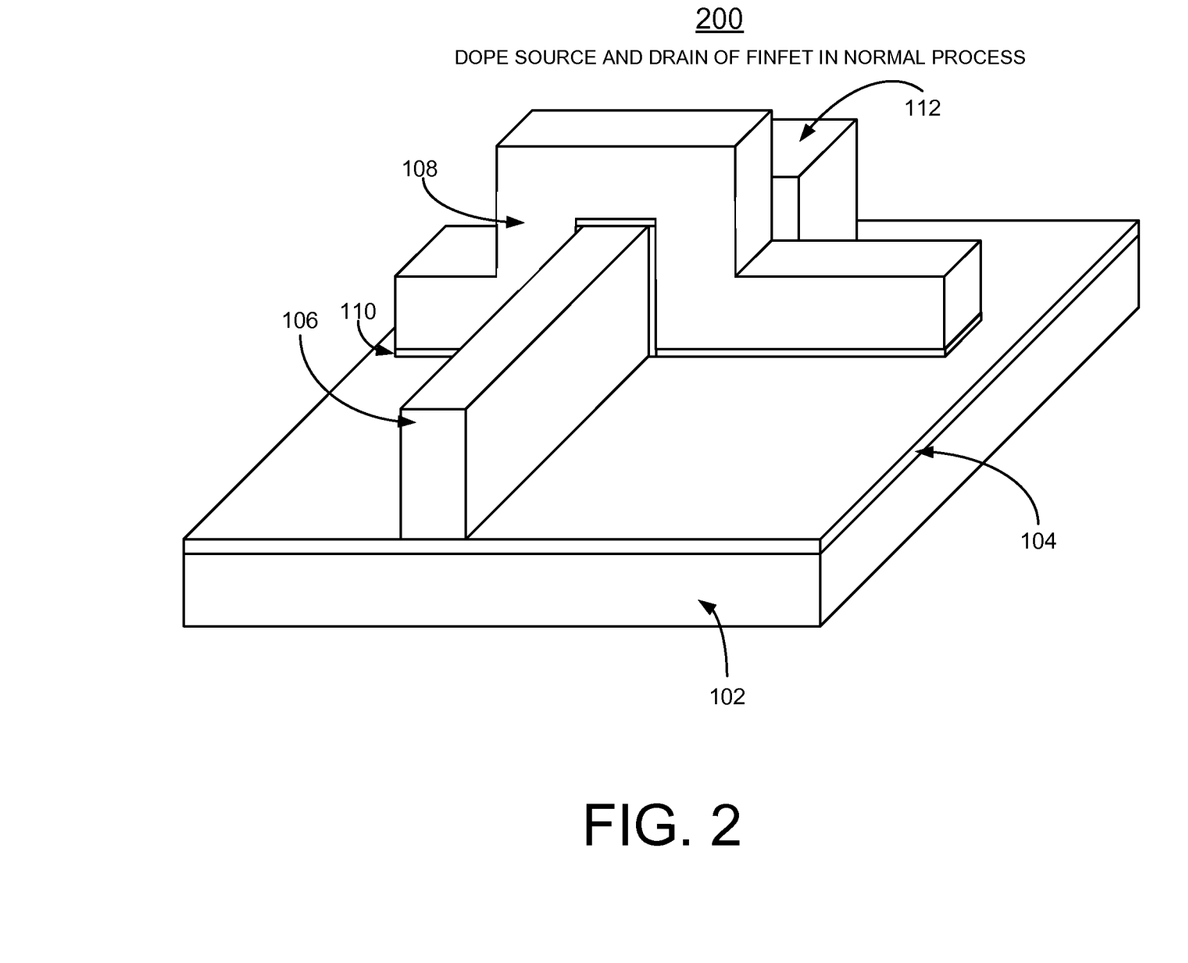

In FIG. 2, a next processing step generally designated by the reference character 200 includes doping the source 112 and drain 106 of the FinFET 100 as part of the normal process.

Figure 3:
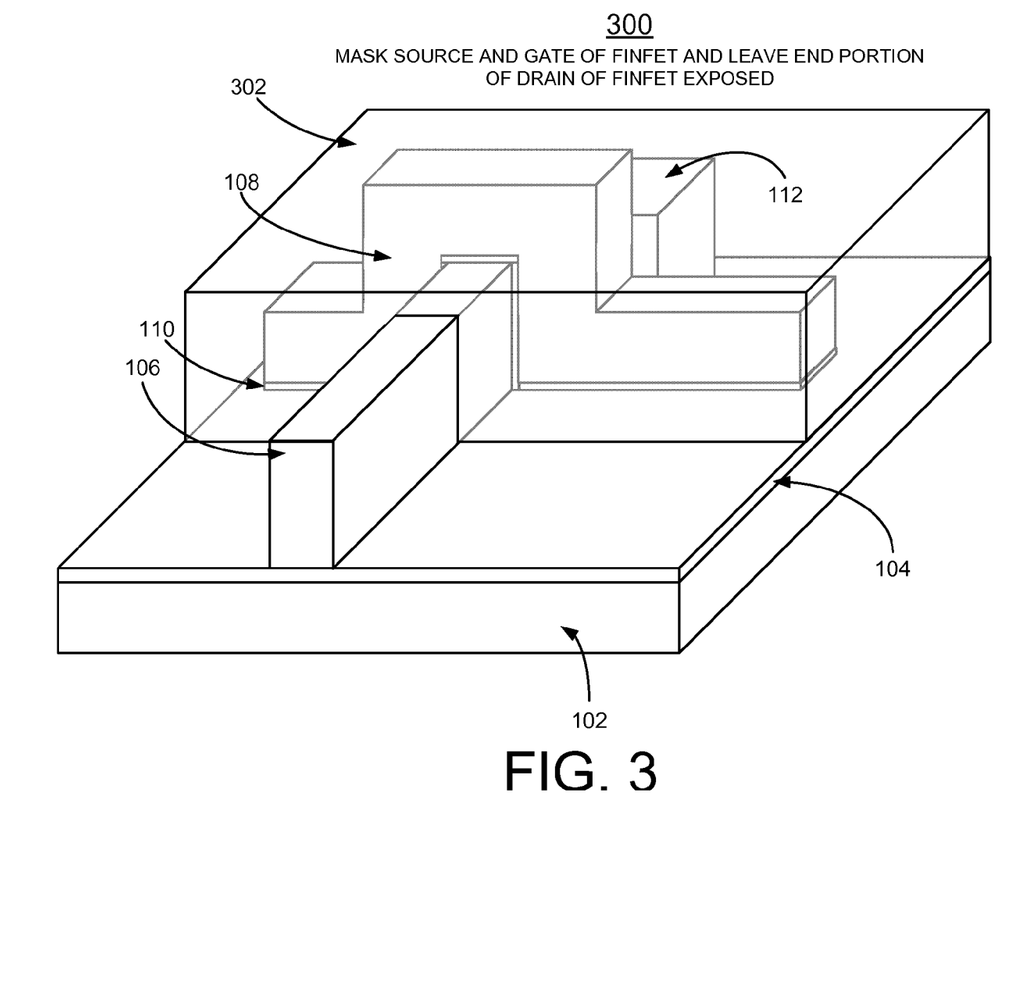

In FIG. 3, a next processing step generally designated by the reference character 300 includes providing a mask 302 for masking of the source 112 and gate 108 and a portion of the drain 106 of the FinFET 100, leaving an end of the drain 106 exposed.

Figure 4:
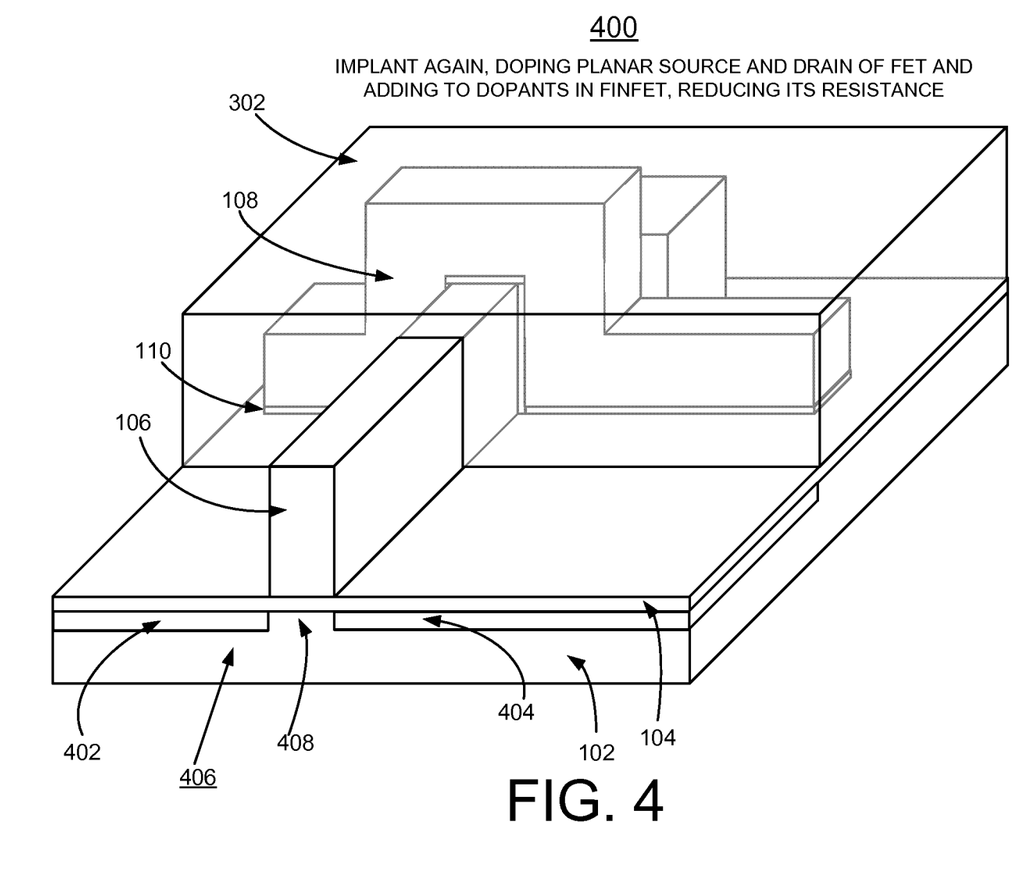

In FIG. 4, a next implant processing step generally designated by the reference character 400 includes doping a planar source 402 and drain 404 of a buried FET generally designated by the reference character 406. The drain 106 of the FinFET 100 is used to separate the new buried transistor source 402 and drain region 406. The FinFET drain 106 is separated substantially from the carrier semiconductor 102 by the thin buried layer 104. The FinFET drain 106 sits over the body indicated by reference character 408 of the newly formed buried transistor 406.

Spacer films including for example, gate dielectric 110, utilized by the FinFET gate 108 can be utilized on the sides of the fin to allow engineering of the dopant profiles of the buried drain 402 and source 404. Traditional well doping techniques defined before the FinFET 100 is etched can be utilized to define N-channel regions, P-channel regions or both where a suitable base doping concentration is not possible.

In FIG. 5, final processing steps providing circuit structure generally designated by the reference character 500 includes oxidize, planarize, etch and fill contacts 502 implementing the enhanced transistor topology with the buried field effect transistor (FET) 406 utilizing the drain 106 of a FinFET 100 as the gate of the new buried FET 406.

Figure 6:
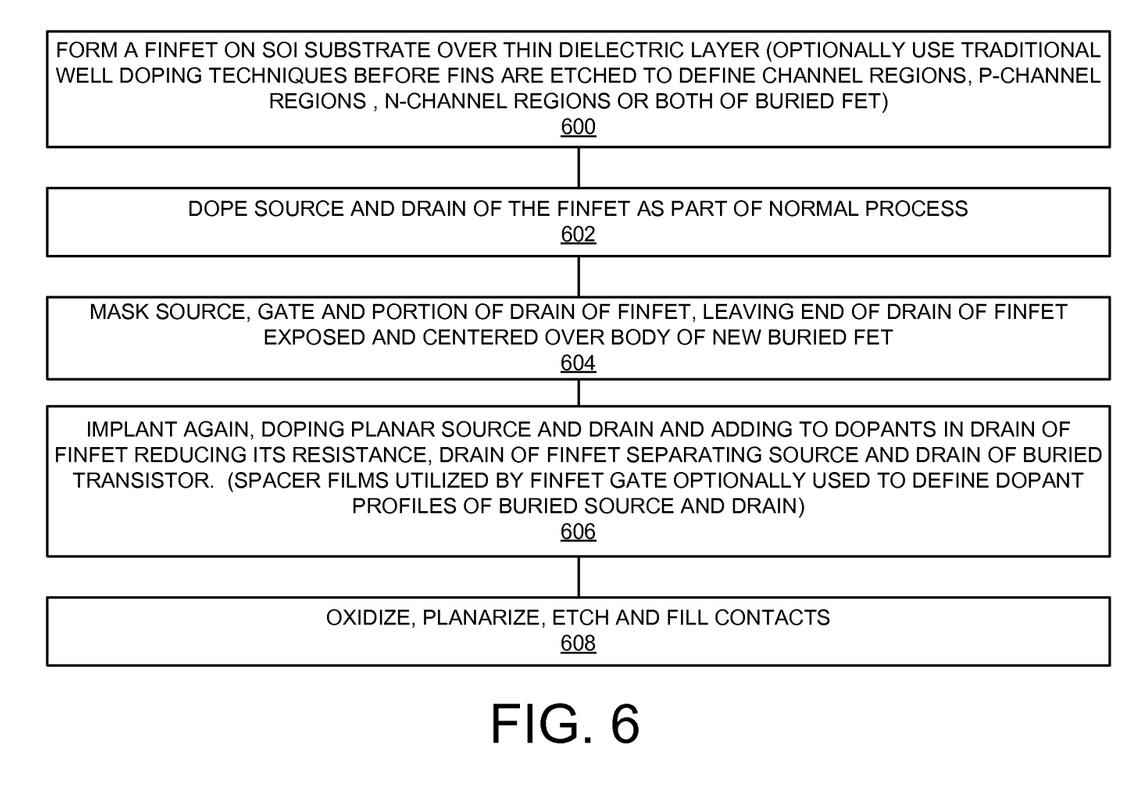
FIG. 6 is a flow chart illustrating example process steps for implementing an enhanced transistor topology with a buried field effect transistor (FET) utilizing the drain of a FinFET as the gate of the new buried FET in accordance with preferred embodiments.

Referring now to FIG. 6, there are shown example process steps for implementing the enhanced transistor topology with a buried field effect transistor (FET) utilizing the drain of a FinFET as the gate of the new buried FET in accordance with preferred embodiments. As indicated in a block 600, a FinFET is formed using traditional fabrication technique on a silicon-on-insulator (SOI) substrate over a thin dielectric layer. At block 600, optionally traditional well doping techniques are used to define channel regions, P-channel regions, N-channel regions or both of the buried FET.

As indicated in a block 602, the source and drain of the FinFET are doped as part of the normal process. Next, the source, gate and a portion of the drain of the FinFET are masked, leaving an end of the drain of the FinFET exposed and centered over the body of the new buried FET as indicated in a block 604.

As indicated in a block 606, another implant is performed, doping planar source and drain, and adding to dopants in the drain of the FinFET reducing its resistance, with the drain of the FinFET separating source and drain of the buried FET. Spacer films utilized by FinFET gate optionally are used to define dopant profiles of buried source and drain. Next, as indicated in a block 608, oxidize, planarize and etch and fill contacts to finalize processing of the enhanced transistor topology with the buried field effect transistor (FET) utilizing the drain of a FinFET as the gate of the new buried FET.

Figure 7:
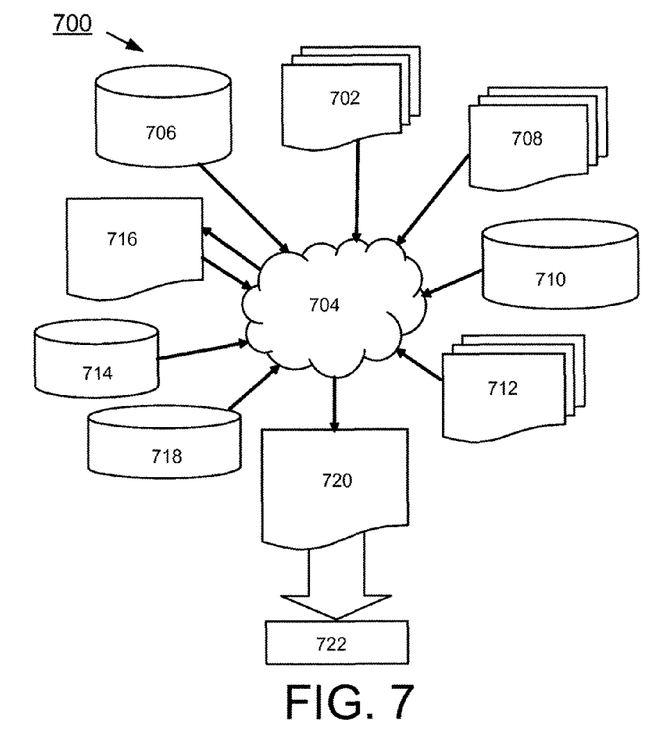
FIG. 7 is a flow diagram of a design process used in semiconductor design, manufacturing, and/or test.

FIG. 7 shows a block diagram of an example design flow 700 used in semiconductor design, manufacturing, and/or test. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit structure 500 in the form of schematics or Hardware Description Language (HDL), a hardware-description language, for example, Verilog, VHSIC Hardware Description Language (VHDL) where VHSIC is Very High Speed Integrated Circuit, C, and the like. Design structure 702 may be contained on one or more machine readable medium. For example, design structure 702 may be a text file or a graphical representation of circuit structure 500. Design process 704 preferably synthesizes, or translates, circuit structure 500 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuits.

Design process 704 may include using a variety of inputs; for example, inputs from library elements 708 which may house a set of commonly used elements, circuits, and devices, including models, layouts, and symbolic representations, for a given manufacturing technology, such as different technology nodes, 22 nm, 14 nm, and smaller, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates embodiments of the invention as shown in FIGS. 1-5 and FIG. 6 along with any additional integrated circuit design or data (if applicable), into a second design structure 720. Design structure 720 resides on a storage medium in a data format used for the exchange of layout data of integrated circuits, for example, information stored in a Graphic Data System (GDS) or GDSII (GDS2), Global Level-1 (GL1), Open Artwork System Interchange Standard (OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-5 and FIG. 6. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an enhanced transistor topology enabling increased circuit density comprising:
a fin field effect transistor (FinFET); said FinFET formed over a dielectric layer; a source of said FinFET having a larger width than a drain; a portion of said drain centered over a body region between a source and a drain of a buried field effect transistor (FET);
said buried field effect transistor (FET) formed in a semiconductor substrate under said dielectric layer and said buried FET utilizing said drain of said FinFET as a gate node.

2. The circuit as recited in claim 1 wherein said FinFET is formed on a silicon-on-insulator (SOI) substrate separated from the semiconductor substrate by the dielectric layer.

3. The circuit as recited in claim 1 wherein said dielectric layer includes a thin dielectric layer over the semiconductor substrate.

4. The circuit as recited in claim 1 wherein said drain of said FinFET is centered over a body of said buried FET.

5. The circuit as recited in claim 1 wherein said drain of said FinFET separates a source and a drain of said buried FET.

6. The circuit as recited in claim 1 wherein said drain of said FinFET is separated by said dielectric layer from said source and said drain of said buried FET.

7. A method for implementing an enhanced transistor topology enabling increased circuit density comprising:
   forming a fin field effect transistor (FinFET) over a dielectric layer; a source of said FinFET having a larger width than a drain; a portion of said drain centered over a body region between a source and a drain of a buried field effect transistor (FET);
   forming said buried field effect transistor (FET) in a carrier semiconductor substrate under the dielectric layer with said buried FET utilizing said drain of said FinFET as a gate node.

8. The method as recited in claim 7 wherein forming said FinFET includes providing a thin dielectric layer for said dielectric layer over the carrier semiconductor substrate.

9. The method as recited in claim 7 wherein forming said FinFET includes forming said FinFET on a silicon-on-insulator (SOI) substrate separated from the semiconductor substrate by the dielectric layer.

10. The method as recited in claim 7 wherein forming said buried FET includes doping a source and said drain of the FinFET using normal FinFET processing.

11. The method as recited in claim 10 wherein forming said buried FET further includes masking said source, a gate and a portion of said drain of said FinFET leaving an end of said drain of said FinFET exposed.

12. The method as recited in claim 11 wherein forming said buried FET further includes doping a source and a drain of said buried FET, and adding to dopants in said exposed end portion of said drain of said FinFET.

13. The method as recited in claim 12 wherein forming said buried FET further includes oxidizing, planarazing, and etching and filling contacts.

14. A design structure embodied in a non-transitory machine readable medium used in a design process, the design structure comprising:
   a circuit tangibly embodied in the non-transitory machine readable medium used in the design process, said circuit for implementing an enhanced transistor topology enabling increased circuit density comprising:
   a fin field effect transistor (FinFET); said FinFET formed over a dielectric layer; a source of said FinFET having a larger width than a drain; a portion of said drain centered over a body region between a source and a drain of a buried field effect transistor (FET);
   said buried field effect transistor (FET) formed in a semiconductor substrate under said dielectric layer and said buried FET utilizing said drain of said FinFET as a gate node, wherein the design structure, when read and used in the manufacture of a semiconductor chip produces a chip comprising said circuit.

15. The design structure of claim 14, wherein the design structure comprises a netlist, which describes said circuit.

16. The design structure of claim 14, wherein the design structure resides on the non-transitory machine readable medium as a data format used for the exchange of layout data of integrated circuits.

17. The design structure of claim 14, wherein the design structure includes at least one of test data files, characterization data, verification data, or design specifications.

18. The design structure of claim 14, wherein said dielectric layer includes a thin dielectric layer over the semiconductor substrate.

19. The design structure of claim 14, wherein said drain of said FinFET is centered over a body of said buried FET, and said drain of said FinFET separates a source and a drain of said buried FET.

20. The design structure of claim 14, whereind said FinFET is formed on a silicon-on-insulator (SOI) substrate separated from the semiconductor substrate by the dielectric layer.

* * * * *